United States Patent [19]

Adam

[11] 4,251,829
[45] Feb. 17, 1981

[54] INSULATED GATE FIELD-EFFECT TRANSISTOR

[75] Inventor: Fritz G. Adam, Freiburg, Fed. Rep. of Germany

[73] Assignee: ITT Industries, Inc., New York, N.Y.

[21] Appl. No.: 80,871

[22] Filed: Oct. 1, 1979

[30] Foreign Application Priority Data

Oct. 14, 1978 [DE] Fed. Rep. of Germany ....... 2844878

[51] Int. Cl.³ .............................................. H01L 29/78
[52] U.S. Cl. ...................................... 357/23; 357/41; 357/24; 357/54
[58] Field of Search ....................... 357/23, 41, 54, 24

[56] References Cited

U.S. PATENT DOCUMENTS

| | | | |
|---|---|---|---|
| 3,996,657 | 12/1976 | Simko | 29/571 |
| 4,004,159 | 1/1977 | Rai | 307/238 |
| 4,099,196 | 7/1978 | Simko | 357/23 |
| 4,115,795 | 9/1978 | Masuoka | 357/24 |
| 4,119,995 | 10/1978 | Simko | 357/23 |
| 4,122,543 | 10/1978 | Bert | 365/182 |
| 4,126,900 | 11/1978 | Koomen | 365/185 |
| 4,131,906 | 12/1978 | Kinoshita | 357/41 |
| 4,162,504 | 7/1979 | Hsu | 357/23 |
| 4,199,772 | 4/1980 | Natori | 357/23 |

FOREIGN PATENT DOCUMENTS 2728927  6/1977  Fed. Rep. of Germany ............. 357/23

*Primary Examiner*—Martin H. Edlow
*Attorney, Agent, or Firm*—John T. O'Halloran; Peter C. Van Der Sluys

[57] ABSTRACT

An insulated gate field-effect transistor is formed with an intermediate floating gate disposed between the gate electrode and the channel region, said floating gate including a control part extending laterally from between the gate electrode and channel region. Said intermediate floating gate including said control part are embedded in partial layers of dielectric material, said dielectric material electrically isolating said control part from at least one auxiliary electrode to which a voltage may be fed with respect to the substrate for capacitive coupling to the control part whereby the threshold voltage of the insulated gate field-effect transistor may be adjusted within a limited range.

8 Claims, 4 Drawing Figures

INSULATED GATE FIELD-EFFECT TRANSISTOR

BACKGROUND OF THE INVENTION

1. Field of the Invention

The present invention relates to insulated gate field-effect transistors and more particularly, to such devices having a floating intermediate gate for adjusting the threshold voltage.

2. Description of the Prior Art

The German Offenlegungsschrift (DE-OS) No. 21 44 436 has already disclosed an integrable insulated gate field-effect transistor whose threshold voltage is capable of being adjusted, preferably to a very low value, either prior to or during operation of the solid-state circuit, with the aid of an intermediate electrode and an auxiliary circuit. This auxiliary circuit occupies additionally a relatively large surface area on the semiconductor wafer of the integrated solid-state circuit.

SUMMARY OF THE INVENTION

It is the object of the invention, therefore, to provide an integrable insulated gate field-effect transistor whose threshold voltage, by requiring a substantially smaller surface area on the semiconductor wafer, can be adjusted either prior to or during the operation.

The invention proceeds from the aforementioned DE-OS No. 21 44 436 and, consequently, relates to an integrable insulated gate field-effect transistor whose threshold voltage can be adjusted within a limited range by means of an intermediate electrode arranged between the gate electrode and the channel region lying between the source area and the gate area, which is embedded between two partial layers of a gate dielectric and comprises a control part laterally in relation to the connecting line between the source area and the drain area next to the channel region.

The aforementioned object is achieved by providing that said control part is galvanically connected to the intermediate electrode, that the d.c. voltage potential of both said control part and said intermediate electrode is floating in the absence of an outer terminal, that said control part is likewise embedded between two partial layers of a dielectric, that the thickness of the two partial layers is so dimensioned that no charges, during operation, can flow to either said intermediate electrode or said control part, and that said control part is coupled by capacitance to at least one auxiliary electrode to which a voltage is fed with respect to the substrate.

Preferably, both the control part and the intermediate electrode are of a coherent design.

DESCRIPTION OF THE INVENTION

Purely from the outward appearance, the integrable insulated gate field-effect transistor according to the invention may also be regarded as a FAMOS field-effect transistor as is known from "Solid-State Electronics" (1974) Vol. 17, pp. 517 to 529. Unlike with the subject matter of the invention, however, the thicknesses of the partial layers on both sides of the intermediate electrode in the FAMOS field-effect transistor are so dimensioned that they can be reached by charges during operation, because for the purpose of achieving the intended alteration of the threshold voltage, there is applied such a programming voltage that charge carriers heated by way of an AVALANCHE breakdown, are injected into the intermediate electrode where they serve to change both the charge and the potential. In the FAMOS field-effect transistor, the area of the intermediate electrode is restricted to the channel region, and a special control part is not provided for.

Figure 1:
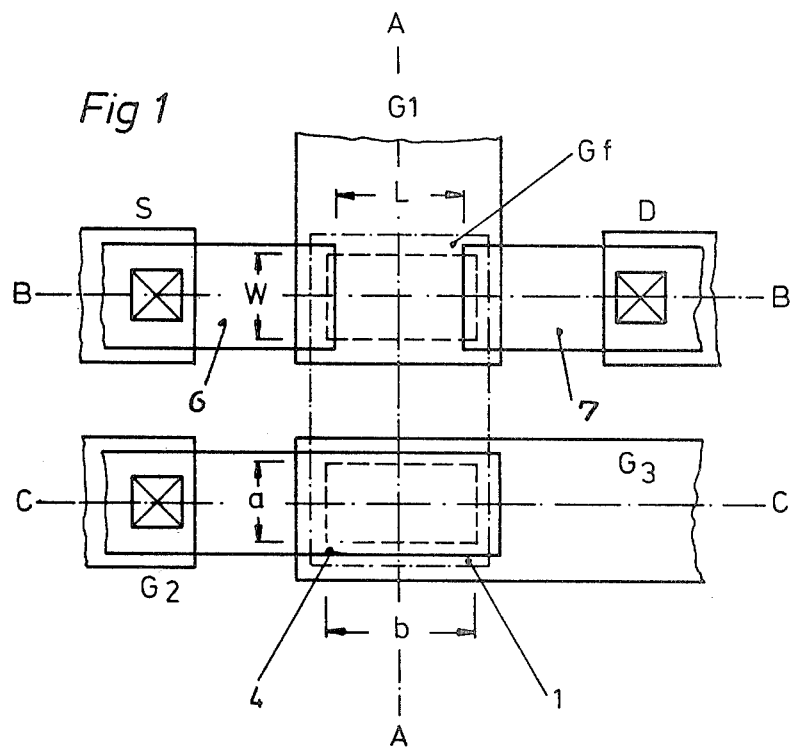
FIG. 1 is the top plan view of an integrable insulated gate field-effect transistor according to the invention shown as a section of an integrated solid-state circuit.
Figure 2:
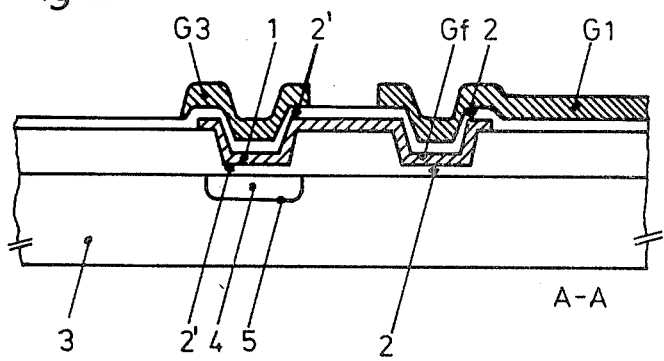
FIG. 2 is the sectional view taken along the line A—A of FIG. 1.
Figure 3:
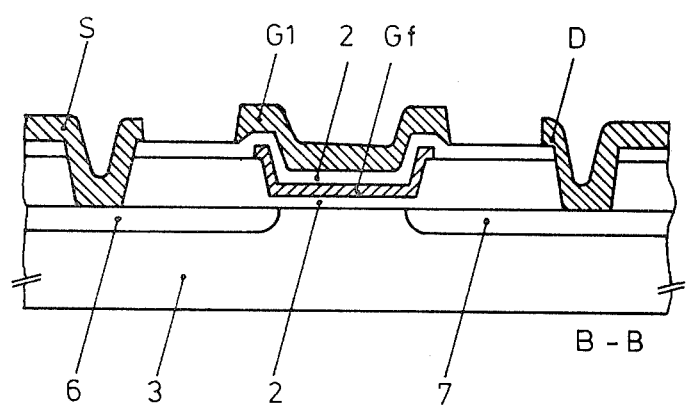
FIG. 3 is the sectional view taken along the line B—B of FIG. 1.

With the subject matter of the invention, the intermediate electrode Gf which, accordingly, may also be called a "floating" gate electrode, is embedded according to FIGS. 1 to 3, between the partial layers 2 of the gate dielectric. These two partial layers 2 should be almost equal in thickness and should be lying approximately within the range between 400 and 700 Å.U. in order not to make the capacitance for coupling to the one or more auxiliary electrodes too small.

Moreover, in the integrable insulated gate field-effect transistors according to the invention, there is provided a control part 1 as is sectionally shown in FIG. 2. This control part 1 is galvanically connected to the intermediate electrode Gf in that both the control part 1 and the intermediate electrode Gf are of a coherent design.

Preferably, both the control part 1 and the intermediate electrode Gf consist of a highly doped polycrystalline silicon, or of a metal, such as aluminum, tungsten, molybdenum or gold. The control part with the intermediate electrode is usually manufactured by way of evaporation or thermal decomposition from the gaseous phase subsequently to the deposition of the partial layer 2' of the gate dielectric adjoining the silicon surface onto this partial layer 2', and by subsequently etching out the layer formed at first through the entire exposed surface, by employing a photolithographic etching process.

When considering the control part 1 as being an extension of the intermediate electrode Gf then, as is illustrated in FIG. 2, the "floating" gate electrode extends beyond the channel region of the field-effect transistor. This control part 1 is likewise embedded between two partial layers 2' next to the channel region of the field-effect transistor, with the source area 6 being contacted via the source electrode S, and with the drain area 7 being contacted via the drain electrode D.

Figure 4:
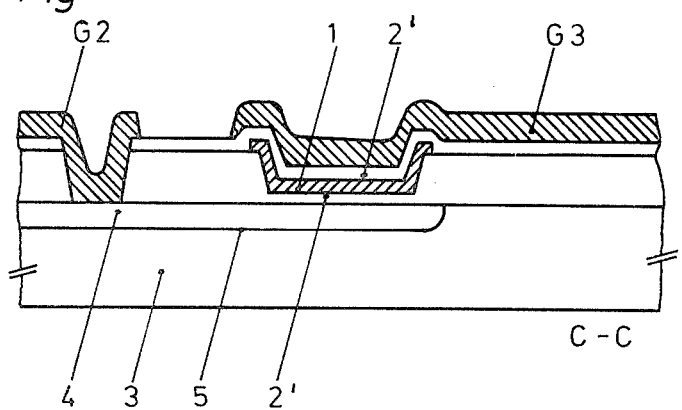
FIG. 4 is the sectional view taken along the line C—C of FIG. 1.

After having deposited the upper partial layers 2 and 2', the control part 1 is lying within the superficial area a and b, and the channel region is lying within the superficial area marked W and b. FIGS. 1, 2 and 4 illustrate one preferred embodiment of the insulated gate field-effect transistor according to the invention in which, below the area a.b, there is arranged an area 4, which is disposed opposite the auxiliary electrode G3 deposited in the form of a layer on the one upper partial layer 2' on the control part 1. By this arrangement there are obtained two auxiliary electrodes which are coupled by capacitance to the control part 1, and to which a d.c. voltage can be fed with respect to the substrate 3. The area 4 is insulated with respect to the surrounding substrate 3 by the pn-junction 5 and is applied to an inverse potential between the zero substrate potential and the drain supply voltage. To the auxiliary electrode G3, however, there may be applied a voltage arbitrary within certain limits, with respect to the substrate.

Preferably, the area 4 is diffused simultaneously with both the source area 6 and the drain area 7, in the conventional way, by employing a planar diffusion process, into the plate-shaped substrate 3.

By suitably selecting the voltages applied to the auxiliary electrodes, and by suitably dimensioning the area a.b, the threshold voltage of the insulated gate field-effect transistor can be adjusted within a wide range. In particular, the insulated gate field-effect transistor, by applying the drain supply voltage to the auxiliary electrode G2 contacting the area 4 and to the layer-shaped auxiliary electrode G3, in the case of a sufficiently large dimensioned area a.b, may be operated as a depletion type field-effect transistor.

In the case of a sufficiently large dimensioned area a.b, the same may moreover also be attained with only one of the two auxiliary electrodes G2 or G3.

The integrable insulated gate field-effect transistor is particularly favorable for being used with integrated solid-state circuits for handling small supply voltages, such as with a CMOS-oscillator-inverter for wrist watches. In this, and in cases of a CMOS-inverter comprising a load field-effect transistor of the depletion type, the latter may be realized without any ion implantation. A further practical application results in an advantageous manner with respect to bucket-brigade circuits using a reduced supply voltage.

What is claimed is:

1. An insulated gate field-effect transistor having a threshold voltage adjustable within a limited range, comprising:
    a substrate;
    a source area formed in said substrate;
    a drain area formed in said substrate and spaced from said source area to define a channel region therebetween;
    a gate electrode disposed over said channel region;
    an intermediate gate electrode disposed between the gate electrode and channel region;
    a control part galvanically connected to the intermediate gate electrode and extending from between the channel region and gate electrode;
    a first pair of partial layers of gate dielectric disposed between the intermediate gate electrode and the channel region and between the intermediate gate electrode and the gate electrode;
    a second pair of partial layers of dielectric embedding the control part, the first and second pair of partial layers having sufficient thickness so that no charges, during operation, can flow to either said intermediate gate electrode or said control part; and
    an auxiliary electrode capacitively coupled to said control part, whereby the d.c. voltage potential of both said control part and said intermediate gate electrode is floating in the absence of a voltage applied to the auxiliary electrode with respect to the substrate and the threshold voltage may be adjusted by the application of a voltage to the auxiliary electrode.

2. An insulated gate field-effect transistor as described in claim 1, wherein the auxiliary electrode is formed in the substrate below the control part and forms a pn junction with respect to the substrate.

3. An insulated gate field-effect transistor as described in claim 1, wherein the auxiliary electrode comprises a layer of conductive material on the upper one of said second pair of partial layers of dielectric and disposed above said control part.

4. An insulated gate field-effect transistor as described in claim 1, wherein the first and second pair of partial layers comprise silicon dioxide having a thickness ranging from 400 to 700 Å units.

5. An insulated gate field-effect transistor as described in claim 1, wherein the intermediate gate electrode including said control part comprises a polycrystalline highly-doped silicon.

6. An insulated gate field-effect transistor as described in claim 1, wherein the intermediate electrode including said control part comprises a metal.

7. An insulated gate field-effect transistor as described in claim 6, wherein the metal is selected from a group of metals consisting of aluminum, tungsten, molybdenum and gold.

8. An insulated gate field-effect transistor as described in claim 1, wherein both said control part and said intermediate gate electrode are of a coherent design.

* * * * *